US009523741B2

(12) United States Patent
Most et al.

(10) Patent No.: US 9,523,741 B2
(45) Date of Patent: Dec. 20, 2016

(54) METHOD FOR DETERMINING AN OVERALL LOSS OF CAPACITANCE OF A SECONDARY CELL

(71) Applicant: SIEMENS AKTIENGESELLSCHAFT, München (DE)

(72) Inventors: Dieter Most, Erlangen (DE); Wolfgang Weydanz, Buckenhof (DE); Holger Wolfschmidt, Erlangen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 129 days.

(21) Appl. No.: 14/399,602

(22) PCT Filed: May 8, 2013

(86) PCT No.: PCT/EP2013/059628
§ 371 (c)(1),
(2) Date: Nov. 7, 2014

(87) PCT Pub. No.: WO2013/167678
PCT Pub. Date: Nov. 14, 2013

(65) Prior Publication Data
US 2015/0115970 A1 Apr. 30, 2015

(30) Foreign Application Priority Data
May 11, 2012 (DE) .................. 10 2012 207 860

(51) Int. Cl.
*G01N 27/416* (2006.01)
*G01R 31/36* (2006.01)
(52) U.S. Cl.
CPC ....... *G01R 31/3627* (2013.01); *G01R 31/3679* (2013.01); *G01R 31/3651* (2013.01)

(58) Field of Classification Search
CPC ............ H02J 2007/005; G01R 31/3627; G01R 31/3651; G01R 31/3679
(Continued)

(56) References Cited

U.S. PATENT DOCUMENTS 7,227,335 B2 *   6/2007   Sakakibara ........ G01R 31/3679
                                                          320/132
8,255,176 B2 *   8/2012   Plestid ............... G01R 31/3679
                                                          320/128
(Continued)

FOREIGN PATENT DOCUMENTS

CN         101243569 A      8/2008
CN         102292864 A     12/2011
(Continued)

OTHER PUBLICATIONS

International Search Report on PCT application No. PCT/EP2013/059628, mailed on Apr. 10, 2013.
(Continued)

*Primary Examiner* — Edward Tso
*Assistant Examiner* — Aaron Piggush
(74) *Attorney, Agent, or Firm* — Schmeiser Olsen & Watts LLP

(57) ABSTRACT

A method for determining an overall loss of capacitance of a secondary cell, for example of an accumulator, which is brought about by ageing processes is provided. The overall loss of capacitance is determined additively from partial losses of capacitance which are determined by means of various parameters from various functions. A partial loss of capacitance is determined under constant peripheral conditions. If the peripheral conditions change, the partial losses of capacitance follow one another directly, i.e. with respect to the same loss of capacitance. The interval of the respective charge throughput rate is shifted here. The overall loss
(Continued)

of capacitance of a secondary cell can be extended to the overall loss of capacitance of a package composed of a plurality of secondary cells.

15 Claims, 1 Drawing Sheet

(58) Field of Classification Search
 USPC .................. 320/134, 136, 157; 324/427, 431
 See application file for complete search history.

(56) References Cited

U.S. PATENT DOCUMENTS

| | | | |
|---|---|---|---|
| 8,497,686 B2 * | 7/2013 | Hoshino | G06Q 30/06 320/132 |
| 2004/0113629 A1 | 6/2004 | Laig-Hoerstebrock et al. | |

FOREIGN PATENT DOCUMENTS

| | | |
|---|---|---|
| DE | 19540827 A1 | 5/1996 |
| DE | 102007037041 A1 | 2/2009 |
| EP | 1387177 A2 | 2/2004 |
| EP | 1450173 A2 | 8/2004 |

OTHER PUBLICATIONS

Li L. et al: Research on cycle performance and capacity fading of lithium-ion secondary batteries Technologies for Power sources; vol. 33, No. 11, 2009.
Wang J. et al: Cycle-life model for graphite-LiFePO4 cells; Journal of Power Sources 196 (2011) 3942-3948; 2011.
Chinese Office Action for Chinese Application No. CN 2013800237097, mailed on Dec. 14, 2015.

* cited by examiner

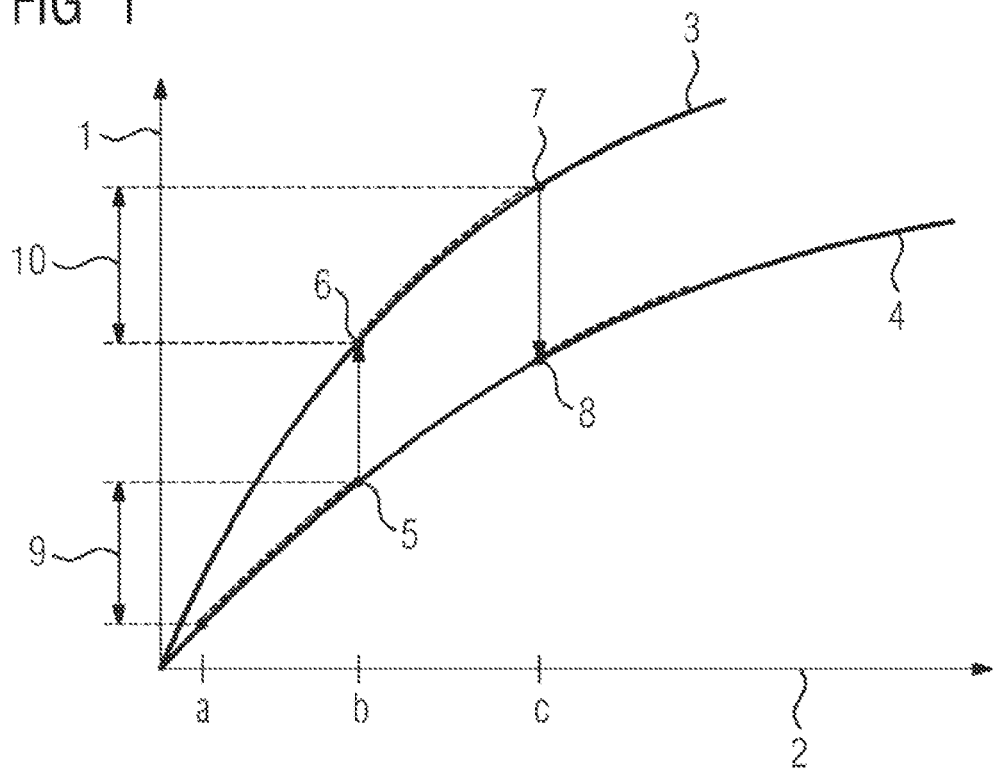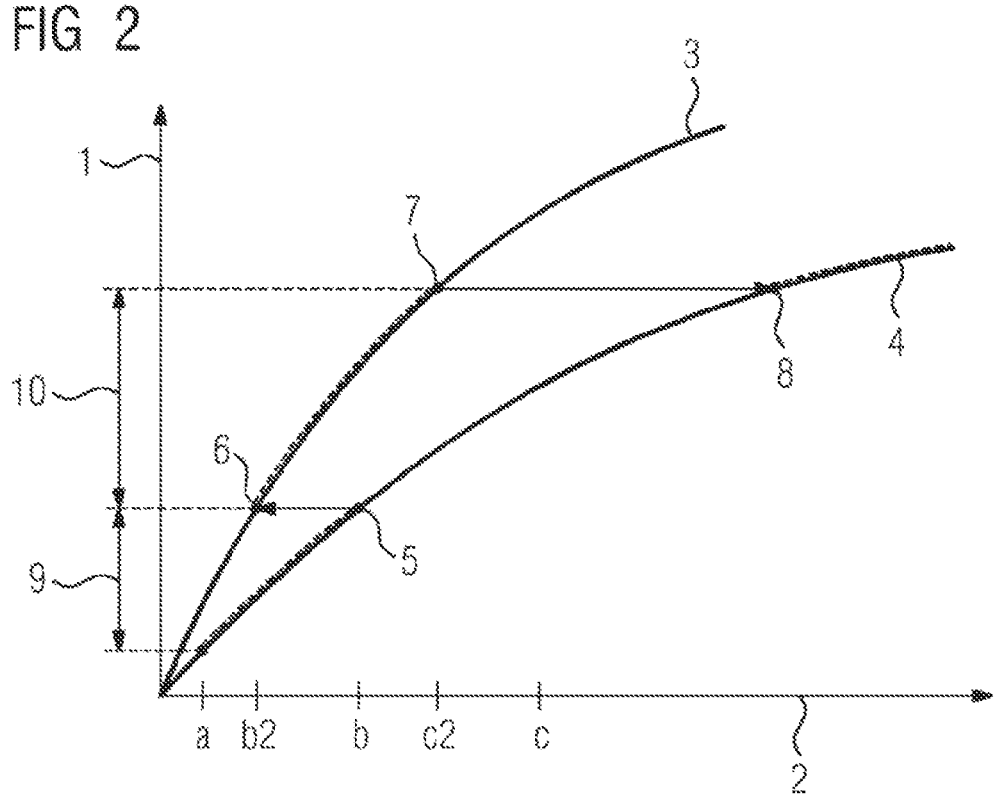

METHOD FOR DETERMINING AN OVERALL LOSS OF CAPACITANCE OF A SECONDARY CELL

CROSS-REFERENCE TO RELATED APPLICATIONS

This application claims priority to PCT Application No. PCT/EP2013/059628 having a filing date of May 8, 2013, based off of DE 102012207860.6 having a filing date of May 11, 2012, the entire contents of which are hereby incorporated by reference.

FIELD OF TECHNOLOGY

The following relates to a method for determining an overall loss of capacitance of a secondary cell which displays aging processes of the secondary cell.

BACKGROUND

Owing to the increasing share of renewable energies in the power generation infrastructure, there are fluctuations in the amount of current in the network. Said fluctuations must be compensated during power generation in order to ensure system stability in the network.

The fluctuations in the current in the network cannot be planned and are very marked in some cases. Consequently, there is a need for energy stores which can remove excess current from the network, or feed it into the network, given a shortage of current.

Secondary cells, in particular rechargeable batteries or accumulators, constitute one known option for storing and supplying current. They offer the option of storing electrical energy as chemical energy and supplying it again when required. Secondary cells further offer the advantage that the capacitance can be adapted by the use of so-called packages as required. Here, a package constitutes a combination of at least two secondary cells.

Secondary cells are, however, subject to aging processes which lead to a loss of capacitance. Said aging processes concern the charging and discharging of the secondary cell. The loss in capacitance is dependent, in particular, on temperature, time, current load, discharge depth and state of charge used when a secondary cell is operated or stored. The determination of the loss of capacitance is performed either directly by measurement—which is mostly impossible during operation—or by simulation with the aid of mathematical models. A simple relationship between charge throughput and loss of capacitance is made in said models. Said relationship can be described using formula 1.

$$Q_{less} = B \cdot \exp\left(\frac{-E_a}{RT}\right) \cdot (I * t)^z \qquad \text{formula 1}$$

In formula 1, R describes the universal gas constant, T temperature, I current and t time. Said parameters are fixed. B represents a prefactor, $E_a$ the activation energy and z an exponent. Said parameters are adjustable. They must be adjusted to boundary conditions of each specific secondary cell by determining functional relationships between, for example, temperature, time, current load, discharge depth or current state of charge.

If the boundary conditions change during operation of the secondary cell, partial losses of capacitance are determined. The partial losses of capacitance are then added in order to determine the overall loss of capacitance. The relationship between the partial losses of capacitance is made in such a way that the charge throughput at the end of a partial loss of capacitance corresponds to the charge throughput at the beginning of the next partial loss of capacitance.

Said process is illustrated in FIG. 1. There, the loss of capacitance is plotted against charge throughput. Two functions which describe two different boundary conditions A and B are, furthermore, to be seen there. The loss of capacitance rises with increasing throughput for both boundary conditions. If the boundary conditions change, the changeover is made from the first function to the second function in the following way.

In a first step, the secondary cell is damaged from a first charge throughput a up to a second charge throughput b under boundary condition A. The boundary conditions change from A to B at a first final value 5. In this case, for further operation under boundary condition B the point of intersection is determined for the same charge throughput with the aid of the function for boundary condition B. The latter now serves as second initial value 6 for operating the secondary cell under boundary condition B.

The boundary conditions change from B to A after an operation from the second charge throughput b up to the third charge throughput c as far as the second final value 7. The determination of the third initial value 8 is performed in the same way for a constant charge throughput. A first partial loss of capacitance 9 and a second partial loss of capacitance 10 for the charge throughput ranges of a to b and b to c are read off at the y-axis and added.

It is disadvantageous in this method that the aging processes and the overall loss of capacitance resulting therefrom are determined without adequately including an instance of predamage to the secondary cell. Furthermore, no account is taken of damages owing, in particular, to events such as large changes in a state of charge. The result of this is an excessively low overall loss of capacitance which does not adequately reflect reality.

SUMMARY

An aspect relates to a method for determining an overall loss of capacitance of a secondary cell which is closer to reality in reflecting the predamage in the case of fluctuating boundary conditions.

In the method according to embodiments of the invention, an overall loss of capacitance of a secondary cell upon passage of a first interval from a first initial value up to a first final value for the charge throughput, and of a second interval, following the first interval, from a second initial value up to a second final value for the charge throughput is determined. The overall loss of capacitance is composed of partial losses of capacitance which are added to form the overall loss of capacitance. In this case, a first partial loss of capacitance is determined for the first interval by means of a first function which describes a relationship between charge throughput and loss of capacitance. A second partial loss of capacitance is determined for the second interval by means of a second function which describes a relationship between charge throughput and loss of capacitance. Here, the second interval is displaced for use in the second function in such a way that the result value of the second function for the second initial value corresponds to the result value of the first function for the first final value.

It is advantageously achieved thereby that the predamage of the secondary cell is more effectively included in the determination of the overall loss of capacitance. Upon a further displacement of the interval, the procedure is performed analogously, the second interval then being denoted as first interval, and a third interval being denoted as second interval. The overall loss of capacitance is then close to reality even at low charge throughputs, that is to say is described at a sufficiently high level. Furthermore, the overall loss of capacitance can be read off the y-axis, since the overall losses of capacitance follow one another directly.

In an advantageous refinement and development of the invention, the overall loss of capacitance of the secondary cell is extended to the overall loss of capacitance of a package which consists of at least two secondary cells. The overall loss of capacitance of a package of secondary cells can thereby be determined. The evaluation of said overall loss of capacitance is then simplified to the effect that it is performed only for one secondary cell. Said refinement is possible without any problem with reference to current, time, discharge depth and state of charge. With reference, in particular, to temperature, it is necessary to form mean values in a suitable way, or to use weighted mean values or maximum values of individual cells, since the latter more effectively reflect the aging behavior of the pack.

In a further advantageous refinement and development of the invention, the first function is used up to a threshold value of the C rate, and the second function is used starting from overshooting of the threshold value of the C rate. When use is made of a plurality of intervals it is preferred for a plurality of different threshold values of the C rate also to make use of a plurality of different functions. The C rate is a measure of the speed at which a secondary cell is charged or discharged relative to its maximum capacitance. A C rate of 1 means that a discharge current discharges the secondary cell within one hour. In particular, in order to determine the overall loss of capacitance for C rates <0.2 large time intervals are selected for checking the boundary conditions. In particular, for C rates >3 it is necessary, by contrast, to select small time intervals for checking the boundary conditions (in particular, temperature, state of charge, voltage level) in order to determine the overall loss of capacitance, since the boundary conditions change significantly more quickly and frequently. The number of calculation steps can therefore be reduced for small C rates.

In a further advantageous refinement and development of the invention, the first function is used up to a threshold value of a change in temperature deviating from the current operating temperature, in particular changes in temperature >2° C., and the second function is used starting from overshooting of the threshold value. When use is made of a plurality of intervals, it is also advantageous to use a plurality of different functions for a plurality of different threshold values of temperature. Below the threshold value of the change in temperature, it is possible to assume constant parameters of the boundary conditions, and so the number of calculation steps is minimized. This also holds true for the absolute temperature. Starting from a first threshold value, in particular from 30° C., a second aging function is assumed as a function of temperature. It is likewise possible to assume further temperature limiting values, preferably at higher temperatures (but below the permitted temperature limit) for further functions.

In a further advantageous refinement and development of the invention, before the addition the partial losses of capacitance are multiplied in each case by a weighting factor adjusted to the partial loss of capacitance. Said weighting factor describes an instance of damage to the secondary cell. The use of said weighting factors advantageously enables parameters which are not required by the function to be included in the overall loss of capacitance.

In a further advantageous refinement and development of the invention, the weighting factor comprises a first parameter which describes a first instance of damage owing to partial charging and/or partial discharging. The partial discharge and partial charge describe the cycle depth. During operation, a defined charge is impressed on the secondary cell, particularly in the charging direction until the cell is subsequently discharged. This is acquired by measurement. A value for the cycle depth can be determined therefrom. In a further embodiment, it is possible in this case to ignore a discharging of the cell impressed up to below a prescribed threshold value. Minimum fluctuations in "the opposite direction" are therefore not understood as partial cycles in said direction. Here, the limiting value can lie, in particular, at 0.1%-1.0% of the SOC. Said first parameter is advantageously also included in the overall loss of capacitance.

In a further advantageous refinement and development of the invention, the weighting factor comprises a second parameter, which describes a second instance of damage owing to a state of charge in extreme regions of low states of charge. In a further advantageous refinement and development of the invention, the weighting factor comprises a third parameter, which describes a third instance of damage owing to a state of charge in extreme regions of maximum states of charge. The boundary conditions of low and maximum states of charge depend strongly on the chemistry of the secondary cell used. In particular, extreme regions for low states of charge are <20%, and for maximum states of charge >90% for lithium ion cells with cathodes with lithium metal phosphates (the metal is preferably one of the elements Fe, Co, Mn). For lithium ion cells with oxide cathodes, instances of damage occur in the upper range of state of charge in an amplified fashion strongly dependent on potential. Again, for Pb-acid batteries, NiCd and NiMH cells and high temperature cells (ZEBRA cell, NaS cell) or metal-air cell, typical ranges of the state of charge can be defined analogously. Furthermore, the ranges can be influenced by the anode chemistry. The severity of the damage can be different for different ranges in the state of charge. The second and third parameters are advantageously also included in the overall loss of capacitance.

In a further advantageous refinement and development of the invention, the weighting factor comprises a fourth parameter, which describes a fourth instance of damage owing to marked changes in the state of charge. Here, marked changes relate to changes in the state of charge by more than 5%. Said third parameter is therefore advantageously also included in the overall loss of capacitance.

In a further refinement and development of the invention, the weighting factor comprises a fifth parameter, which describes a fifth instance of damage owing to faulty operating states, in particular exceeding of the maximum operating temperature. This can also be performed without operating the secondary cell, in particular by external heating. The damage to the secondary cell is here advantageously reflected as closely as possible to reality in the overall loss of capacitance.

In a further refinement and development of the invention, the parameters are determined by means of measurements on at least one secondary cell. The parameters can then advantageously be summarized in tables. Said table is stored in a memory device so that it is possible to access the data during the operation of the secondary cell. The number of measurements can thereby be reduced.

BRIEF DESCRIPTION

FIG. 1 depicts a graph showing a loss of capacitances plotted against charge throughput; and FIG. 2 depicts a graph showing two functions which describe the loss of capacitances as a function of the charge throughput.

DETAILED DESCRIPTION

Embodiments of the invention are explained yet further below with the aid of an exemplary embodiment with reference to the drawing. FIG. 2 shows two functions which describe the loss of capacitance as a function of the charge throughput.

The two functions 3, 4 reproduce two different boundary conditions A and B. In a first step, the secondary cell is operated from a first charge throughput a up to a second charge throughput b under boundary condition A. At the first final value 5, the boundary conditions change from A to B. In this example, the change from boundary condition A to B describes a change in temperature deviating from the original operating temperature by 5° C.

For the subsequent operation under boundary condition B, the point of intersection with the function for boundary condition B is determined for the same loss of capacitance of the first final value 5 of the boundary condition A. Said point of intersection now serves as second initial value 6 for the operation of the secondary cell under boundary condition B. The second cell is now operated under boundary condition B from the second charge throughput b up to a third charge throughput c. The second charge throughput b is displaced with the second initial value 6 toward a fourth charge throughput b2. The third charge throughput c is also displaced toward a fifth charge throughput c2. Once the second final value 7 has been reached, the boundary conditions change, in turn, from B to A. The determination of the third initial value 8 is performed similarly with a constant loss of capacitance 1. The first partial loss of capacitance 9 and the second partial loss of capacitance 10 for the charge throughput ranges a to b and b to c can advantageously be read off directly on the y-axis.

The first partial loss of capacitance 9 is determined for a charge throughput from a to b. The secondary cell was operated in the meantime in the edge region of a charge state >90%. The first partial loss of capacitance is therefore weighted with a factor of 1.2 such that the overall loss of capacitance is higher than after addition of the non-weighted first and second partial losses of capacitance 9 and 10.

Although the invention was illustrated and described in detail by the preferred exemplary embodiments, the invention is not restricted by the disclosed examples. Other variations can be derived therefrom by a person skilled in the art, without departing from the scope of protection of the invention.

The invention claimed is:

1. A method for determining an overall loss of capacitance of a secondary cell for a first interval from a first initial value of a first charge throughput up to a first final value of a second charge throughput, and for a second interval, following the first interval, from a second initial value of a third charge throughput up to a second final value of a fourth charge throughput, comprising:

determining a first partial loss of capacitance for the first interval, defined by a difference between a loss of capacitance at the first final value of the second charge throughput and the loss of capacitance at the first initial value of the first charge throughput, the first final value being part of a first function;

determining a second partial loss of capacitance for the second interval, defined by a difference between the loss of capacitance at the second final value of the fourth charge throughput and the loss of capacitance at the second initial value of the third charge throughput, the second final value being part of a second function; and determining the overall loss of capacitance by means of adding the first partial loss of capacitance and the second partial loss of capacitance;

wherein a result value of the second function for the second initial value corresponds to a result value of the first function for the first final value and wherein the first partial loss and the second partial loss of capacitance are determined by a means of measurements on at least one secondary cell.

2. The method as claimed in claim 1, wherein the overall loss of capacitance of the secondary cell is extended to the overall loss of capacitance of a package which comprises at least two secondary cells.

3. The method as claimed in claim 1, wherein the first function is used up to a threshold value of a measure of a speed at which the secondary cell is charged or discharged, and the second function is used starting from overshooting of a threshold value of the measure of the speed.

4. The method as claimed in claim 1, wherein the first function is used up to a threshold value of a change in temperature deviating from an operating temperature, and the second function is used starting from overshooting of the threshold value.

5. The method as claimed in claim 1, wherein before adding the first partial loss of capacitance and the second partial loss of capacitance, the first partial loss of capacitance and the second loss of capacitance are each multiplied by a weighting factor which is adjusted to the partial loss of capacitance, further wherein the weighting factor describes an instance of damage to the secondary cell.

6. The method as claimed in claim 5, wherein the weighting factor comprises a first parameter which describes a first instance of damage owing to at least one of a partial charging and a partial discharging.

7. The method as claimed in claim 6, wherein the weighting factor comprises a second parameter, which describes a second instance of damage owing to a state of charge in extreme regions of low states of charge.

8. The method as claimed in claim 7, wherein the weighting factor comprises a third parameter, which describes a third instance of damage owing to a state of charge in extreme regions of maximum states of charge.

9. The method as claimed claim 8, wherein the weighting factor comprises a fourth parameter, which describes a fourth instance of damage owing to marked changes in the state of charge.

10. The method as claimed in claim 9, wherein the weighting factor comprises a fifth parameter, which describes a fifth instance of damage owing to faulty operating states.

11. The method as claimed claim 5, wherein at least two partial losses of capacitance comprise at least one constant parameter.

12. The method as claimed in claim 9, wherein the parameters are determined by means of measurements on at least one secondary cell.

13. The method as claimed in claim 6, wherein the state of charge in extreme regions of low states of charge includes states of charge less than 20%.

14. The method as claimed in claim 7, wherein the state of charge in extreme regions of maximum states of charge includes states of charge greater than 90%.

15. The method as claimed claim 8, wherein the marked changes in the state of charge include changes by more than 5%.

* * * * *